United States Patent [19]

Yazawa et al.

[11] Patent Number: 4,578,693
[45] Date of Patent: Mar. 25, 1986

[54] SEMICONDUCTIVE PHOTODETECTOR DEVICE

[75] Inventors: Yoshiaki Yazawa, Hitachi; Nobuaki Miyakawa, Ibaraki; Toji Mukai, Hitachi; Takahide Ikeda, Tokorozawa; Tatsuya Kamei, Hitachi, all of Japan

[73] Assignee: Hitachi, Ltd., Tokyo, Japan

[21] Appl. No.: 505,447

[22] Filed: Jun. 17, 1983

[30] Foreign Application Priority Data

Jun. 18, 1982 [JP] Japan ................................ 57-104009

[51] Int. Cl.⁴ ...................... H01L 27/14; H01L 31/00
[52] U.S. Cl. ........................................ 357/30; 357/59; 357/84
[58] Field of Search ..................... 357/30, 32, 20, 45, 357/65, 68, 30 D, 30 H, 59, 84, 23 C, 23.6

[56] References Cited

PUBLICATIONS

Lin et al., "Shielded Silicon Gate Complementary MOS Integrated Circuit", Nov. 1972, pp. 1199-1207, IEEE Transactions on Electron Devices, vol. ED-19, No. 11.
Mukai et al., "Photodiode Arrays for Spectrometry Using UV Light," May 1982, pp. 161-165, IEEE, Proceeding of the Custom Integrated Circuit Conference.

Primary Examiner—James W. Davis
Assistant Examiner—Georgia Y. Epps
Attorney, Agent, or Firm—Antonelli, Terry & Wands

[57] ABSTRACT

In a semiconductive photodetector device having a semiconductor substrate and a plurality of photodiodes juxtaposed in one major surface of the semiconductor substrate, exposed edges of adjacent pn junctions of adjacent photodiodes are covered with a polysilicon film.

25 Claims, 7 Drawing Figures

SEMICONDUCTIVE PHOTODETECTOR DEVICE

BACKGROUND OF THE INVENTION

The present invention relates to a semiconductive photodetector device having a construction in which a great number of photodiodes are juxtaposed on one major surface of a semiconductor substrate.

As well known in the art, intensity of light irradiated on a pn junction can be measured by reading voltage or current representative of an amount of carriers created by the irradiation of light. The semiconductive photodetector device based on this phenomenon has been used as a photosensor unit in an imaging apparatus, an OCR (optical card reader), a position detecting apparatus, a spectrophotometer or the like since its light receiving portion can be miniaturized by using integrated circuit technique to thereby obtain high resolution and it can be made integral with its peripheral circuits such as a detection signal processing circuit and a drive circuit to thereby assure high reliability. In this type of semiconductive photodetector device, a great number of photodiodes are juxtaposed at predetermined intervals on one major surface of a semiconductor substrate, on which major surface the detection signal processing circuit, drive circuit and the like circuit are formed by integrated circuit technique. The semiconductive photodetector device comprised of the juxtaposition of the great number of photodiodes is required to provide high resolution and to have a wide dynamic range within which output signals varies with the intensity of incident light.

High resolution can be accomplished by increasing the number of photodiodes to be integrated on the semiconductor substrate. With a view to improving yield, on the other hand, desirability is such that the semiconductor substrate be reduced in size as small as possible. Accordingly, in order to improve the resolution, the junction area of the photodiode must be minimized. With a decreased junction area of the photodiode, however, the dynamic range will disadvantageously be narrowed as will be described later.

Meanwhile, as far as the dynamic range is concerned, the lower limit can be lowered by decreasing the dark current and the upper limit can be raised by increasing the saturating exposure amount.

The dark current is mainly due, for one thing, to deterioration by light irradiation, particularly of ultraviolet light, of a portion of the pn junction exposed to the semiconductor substrate surface and, for another thing, to crystalline properties present in the vicinity of the pn junction. The former cause can be suppressed by providing a light shielding film above the exposed portion of pn junction to optically shield the same and the latter cause can be suppressed by minimizing the junction area. However, reduction in the junction area decreases the saturating exposure light amount as will be described later, leading to a disadvantage that the upper limit of the dynamic range is lowered. For the purpose of shielding, a light shielding film 105 is usually formed as shown in FIG. 1. Even with the light shielding film, the irradiated light is subject to multiple reflections as illustrated by dotted lines and penetrates into a portion underlying the light shielding film 105 with the result that deterioration (i.e. experimentally observed increase of dark current across the pn junction) still takes place at an edge of a pn junction 106. This disadvantage will be aggravated as a photo-insensitive region between adjacent photodiodes is made narrower so as to improve the resolution. For example, employing the 5 μm rule LSI technique, the photo-insensitive region has a width of 46 μm whereas employing the 3 μm rule LSI technique, width is reduced at a ratio of 1/2.4, measuring 19 μm. Correspondingly, the width of the light shielding film is also narrowed and hence, the penetration of light by way of the multiple reflections is increased. In FIG. 1, reference numeral 101 designates a semiconductor substrate of one conductivity type, 102 semiconductor regions of the other conductivity type formed in one major surface 108 of the semiconductor substrate 101 in juxtaposition relationship, 103 an insulating film formed on the one major surface 108, and 104 electrodes making ohmic contact to the semiconductor regions 102. In an integrated circuit, the insulating film 103 is comprised of a silicon oxide film 1031 in close contact with the surface of semiconductor substrate 101 and a layer 1032 of phosphosilicate glass formed on the film 1031. A major portion of the electrode 104 and the light shielding film 105 are surrounded by the phosphosilicate glass layer, so that oxidization of the electrode 104 and light shielding film 105, both made of aluminum, can be prevented. Reference is made to Proceedings of the Custom Integrated Circuits Conference, IEEE, May 1982, pp. 161-165.

The saturating exposure amount will now be explained. When the photodiode is irradiated with light of high intensity or long duration, a phenomenon occurs wherein the photodiode is saturated during a period for reading signals, that is to say, electric charges stored in the photodiode at the beginning of the signal reading period are recombined with hole-electron pairs created by the light irradiation to disappear before the signal reading period terminates. When the photodiode is saturated, output signals proportional to intensity of incident light can not be produced. Further, when the irradiation of light on the saturated photodiode continues, electric charges excited by photons overflow, turning into noises which have an adverse effect on the other photodiodes. Thus, the saturating exposure amount is defined to denote resistance against the saturation of photodiode. The saturating exposure amount can be increased by increasing the amount of carriers to be stored at the beginning of the signal reading period, namely, increasing the junction capacitance. In order to increase the junction capacitance, the area of pn junction must be increased. However, increase in the pn junction area disadvantageously results in increase in the dark current and decrease in the resolution.

SUMMARY OF THE INVENTION

An object of the present invention is to provide a semiconductive photodetector device with a wide dynamic range and superior characteristics. More specifically, the dark current in a semiconductive photodetector device can be reduced extensively by preventing the ultraviolet irradiation on pn junction edges. Further, the photocell capacitance and hence the saturating exposure amount can be increased by forming an additional capacitor.

Another object of the present invention is to provide a semiconductive photodetector device with improved resolution.

To accomplish the above objects in accordance with teachings of the present invention, in a semiconductive photodetector device in which a plurality of photodiodes are juxtaposed on one major surface of a semiconductor substrate and exposed edges of pn junctions of adjacent photodiodes and a portion of the semiconductor substrate lying between the adjacent photodiodes are shielded by a light shielding film of a metallic material, a polysilicon film is interposed between the light shielding film and the semiconductor substrate to shield the exposed edges of pn junctions of the adjacent photodiodes and the portion of the semiconductor substrate lying between the adjacent photodiodes. Since polysilicon strongly absorbs ultraviolet radiation and hence has ability to greatly shield ultraviolet radiation which has been found to be responsible for the deterioration of the exposed edges of the pn junctions, incident light which would otherwise penetrate by way of multiple reflections even in the presence of the light shielding film can be shielded completely by the polysilicon film and hence the deterioration of the pn junction edges can be prevented. Accordingly, a semiconductive photodetector device with a decreased dark current even after a long time use, in other words, with reduced noise and with a decreased lower limit of the dynamic range can be materialized. Preferably, this polysilicon film may be formed on the semiconductor substrate surface through a thin silicon oxide film from the standpoint of stabilization of the pn junction edge and prevention of penetration of light by way of multiple reflections.

The present invention is further featured in that the polysilicon film, serving as a light shielding member, forms an additional capacitor with the underlying semiconductor region of the photocell. The polysilicon film may be electrically connected to the ground potential or the substrate to form a capacitor connected in parallel with the junction capacitance. The peripheral portion of the semiconductor region of each photocell may be highly doped to form a good electrical contact with the electrode and to form a good electrode of the capacitor. The polysilicon film may also be highly doped to form a good electrode of the capacitor. The polysilicon film also forms another parallel capacitor with the covering electrode member. These capacitors apparently increase the amount of the maximum electric charge to be stored in the photodiode at the beginning of the signal reading period to thereby increase the saturating exposure amount. As a result, the upper limit of the dynamic range can be raised.

BRIEF DESCRIPTION OF THE DRAWINGS

Other features and advantages of the present invention will become apparent from the following detailed description taken in conjunction with the accompanying drawings, in which.

DESCRIPTION OF THE PREFERRED EMBODIMENTS

The present invention will now be described by way of example with reference to the drawings.

Figure 1:
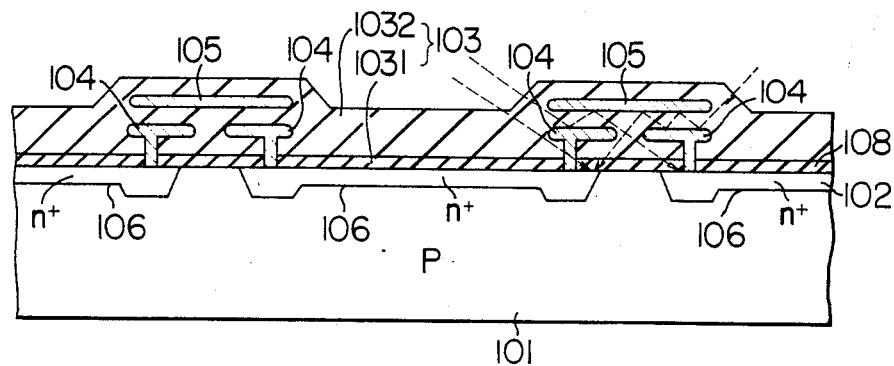
FIG. 1 is a schematic sectional view illustrating a prior art semiconductive photodetector device.
Figure 3:
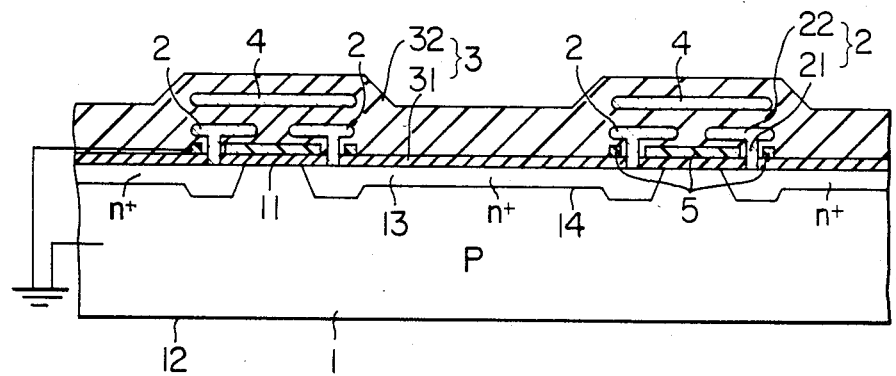
FIG. 3 is a sectional view taken on line III—III in FIG. 2A.
Figure 2A:
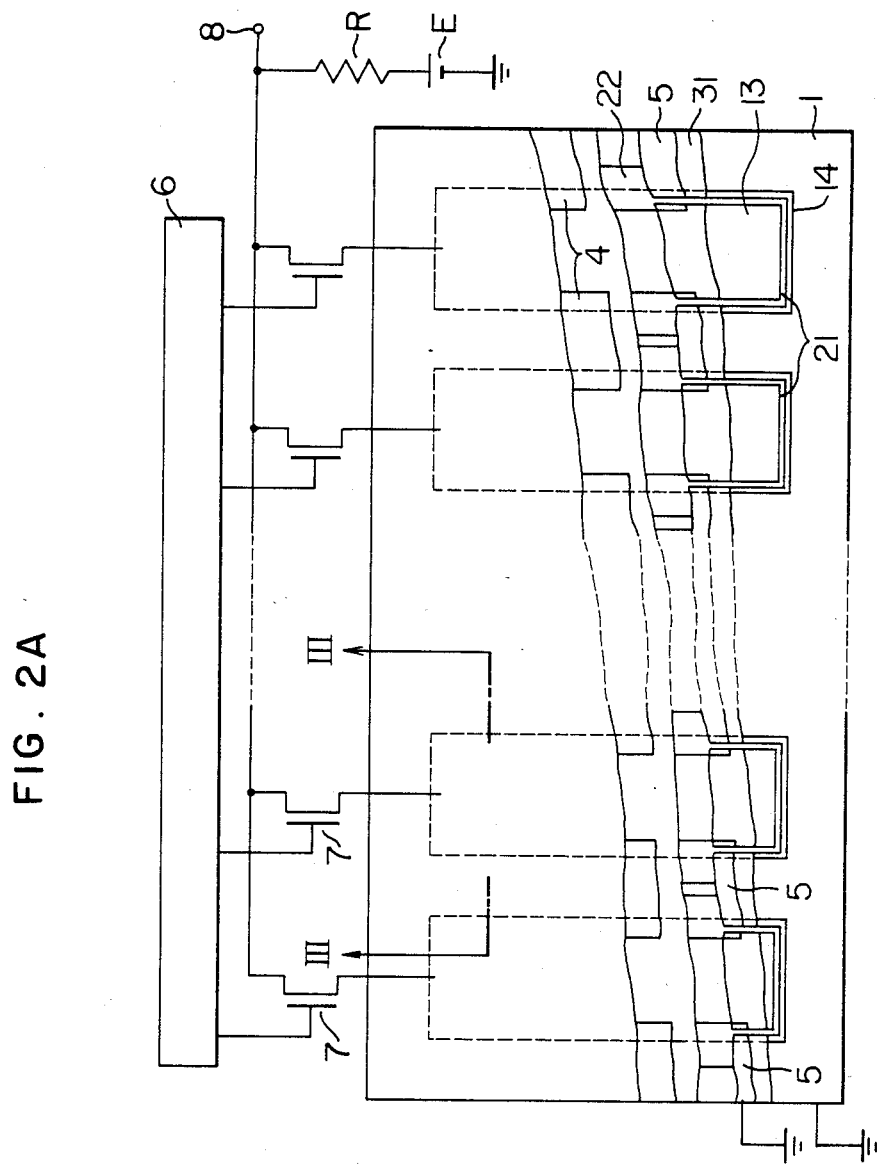
FIGS. 2A and 2B are a schematic plan view and a schematic perspective view illustrating a typical embodiment of a semiconductive photodetector device according to the present invention.
Figure 2B:
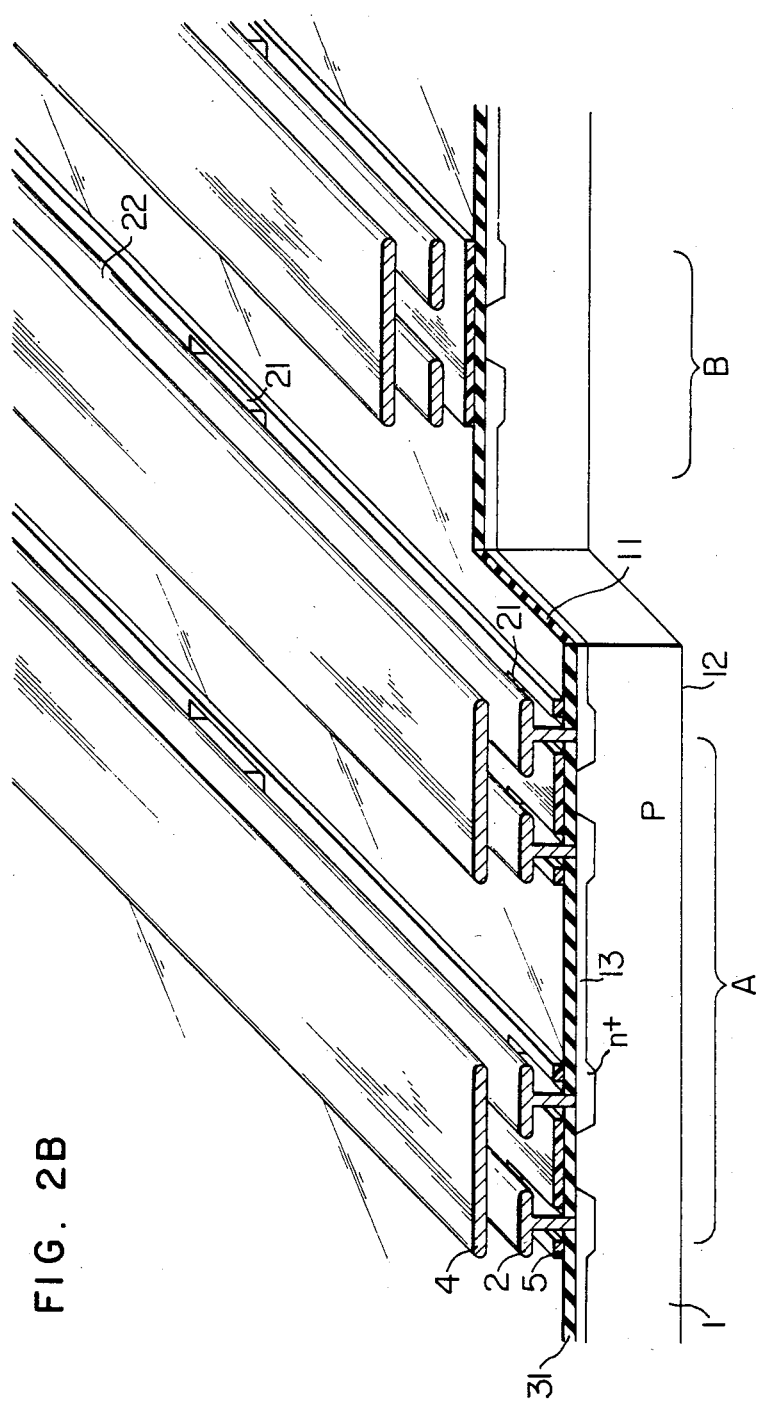

FIGS. 2A, 2B and 3 show a typical embodiment of a semiconductive photodetector device according to the invention.

As shown in these Figures, the semiconductive photodetector device comprises a semiconductor substrate 1 of p-conductivity type having a pair of major surfaces 11 and 12, a plurality of semiconductor regions 13 of n-conductivity type which are juxtaposed adjacent to or continuous to one major surface 11 of the semiconductor substrate 1 serving as a light receiving surface, and pn junctions 14 of photodiodes formed between the semiconductor substrate 1 and the semiconductor regions 13 and having their edges exposed to the one major surface 11. An electrode 2 for each diode is located on the one major surface 11 of semiconductor substrate 1 and makes ohmic contact to the looped peripheral edge of each of the semiconductor regions 13. As seen in FIG. 3, the electrodes 2 make such ohmic contact by passing through apertures in, e.g., a polysilicon film 5, discussed in more detail *infra*. The electrode 2 may be made of a metal such as aluminium. In FIG. 2B, each of the electrodes 2 is shown to have leg portions 21 each of which extends in a direction perpendicular to the one major surface 11 and has one end in ohmic contact to the semiconductor region 13 at the peripheral portion. Each electrode 2 has a common flat portion 22 which is contiguous to the other ends of the leg portions 21 and which extends in a direction substantially parallel to the one major surface 11. The leg portions may also be made in a continuous looped shape. The peripheral portion of the semiconductor region 13 to which the electrode 2 makes ohmic contact is made thicker than the remaining portion serving as a light receiving region so as to provide a low resistivity good ohmic contact while a highly sensitive light receiving area is provided by the central thin region. The light receiving area should have a shallow junction surface for providing good response to blue light. An insulating film 3 formed on the one major surface 11 of semiconductor substrate 1 has a first layer 31 made of, for example, silicon oxide and in direct contact with the one major surface 11 and a second layer 32 (not shown in FIG. 2B) made of, for example, phosphosilicate glass which is formed on the first layer 31 to surround the electrodes 2. A light shielding film 4 made of a metallic material such as aluminium lies above the electrodes 2 and extends to shield edges of adjacent pn junctions 14 and a portion of the semiconductor substrate which lies between the edges of adjacent pn junctions and which is exposed to the one major surface 11. Although the light shielding film 4 is disposed inside the second layer 32 of insulating film 3 in an illustration of FIG. 3, it may overlie the second layer 32. A polysilicon film 5 is interposed between the first and second layers 31 and 32 of the insulating film 3, extending to shield the edges of adjacent pn junctions 14 and the portion of the semiconductor substrate which lies between the edges of adjacent pn junctions and which is exposed to the one major surface 11. This polysilicon film 5 is doped with impurity for reducing the electrical resistivity and is grounded. The polysilicon film 5 is electrically insulated from the $n^+$ regions 13 and the electrode 2 through the insulating film 3. There are seen in FIG. 2A a shift register 6, switching MOS transistors 7 each having a gate connected to the shift register 6, a source or drain connected to the electrode 2 and a drain or source connected to a video output terminal 8, and a load resistor R and a power supply E for reading signals which are connected in series between the video output terminal 8 and the ground. The shift register 6 and switching MOS transistors 7 may be formed inside the semiconductor substrate 1.

Figure 4:
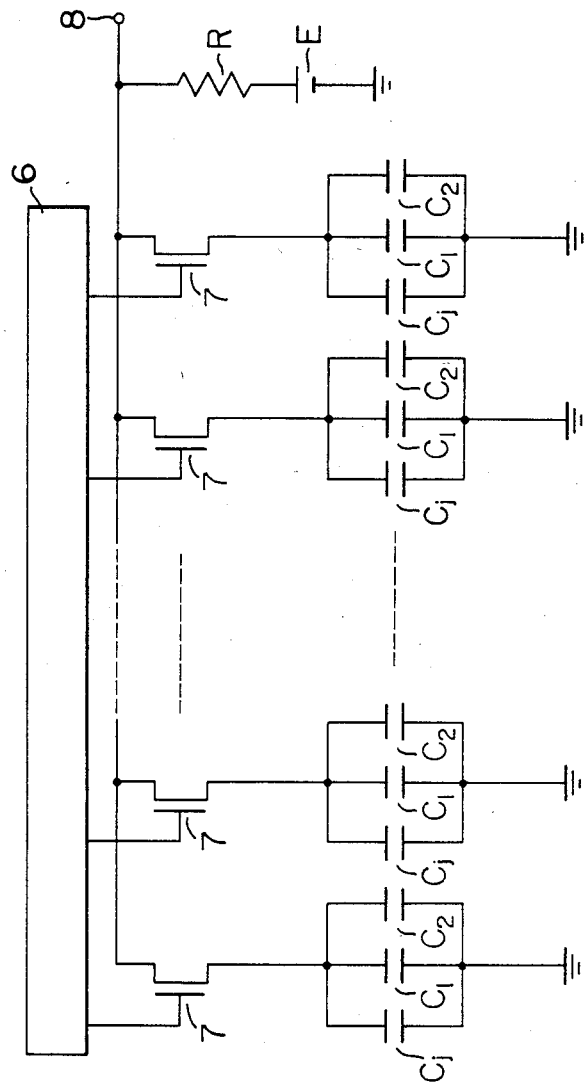
FIG. 4 is an equivalent circuit of the device shown in FIG. 2.

With the semiconductive photodetector device of the construction described as above, capacitors $C_1$ and $C_2$ are formed in parallel with a capacitor Cj of the pn junction 14 between the polysilicon film 5 and the semiconductor region 13 and also between the polysilicon film 5 and the electrode 2 (particularly the flat portion 22), as shown in an equivalent circuit of FIG. 4.

The operation of the semiconductive photodetector device according to the present invention will be described with reference to FIG. 4.

Each of the photodiodes is responsive to a signal from the shift register 6 to turn on a switching MOS transistor 7 so that a junction capacitor $C_j$ of a photodiode is charged from the signal reading power supply E through the load resistor R. Concurrently therewith, capacitors $C_1$ and $C_2$ connected in parallel with the junction capacitor $C_j$ are also charged simultaneously. Subsequently, the switching MOS transistor 7 is turned off and the photodiode is irradiated with light to create amounts of photo-ionized electron-hole pairs corresponding to a quantity of light irradiated into the photodiode. Consequently, the photodiode discharges electric charges in accordance with the quantity of irradiated light. Thereafter, the switching MOS transistor 7 is again turned on in response to a signal from the shift register 6 to thereby charge the junction capacitor $C_j$ (and associated capacitors $C_1$ and $C_2$) of the photodiode from the signal reading power supply E. Charging current is of a magnitude which corresponds to the amount of electric charges which have been discharged. Consequently, across the load resistor R, a voltage drop develops which corresponds to the amount of discharged electric charges. This voltage drop is detected via the video output terminal 8 to measure the quantity of light received by the photodiode.

To operate a photodiode array, switching MOS transistors 7 are sequentially driven by the shift register 6 at timings of signal reading so as to be turned on sequentially for a predetermined time interval, whereby at the juxtaposed photodiodes, quantities of received light represented by the amounts of discharged electric charges are sequentially read out and amounts of charging electric charges corresponding to amounts of discharged electric charges are sequentially replenished. This type of semiconductive photodetector device operable in a manner described above is commonly called a self-scanned photodiode array.

When in the above operation a quantity of light in excess of the quantity necessary for completely discharging the electric charges stored in a junction capacitor $C_j$ associated with a particular photodiode is irradiated on the particular photodiode, the junction capacitor $C_j$ tending to be removed of electric charges is replenished with electric charges from capacitors $C_1$ and $C_2$ connected in parallel with the junction capacitor $C_j$ and therefore, the saturation phenomenon will not take place before all of the junction capacitor $C_j$ and capacitors $C_1$ and $C_2$ are discharged. In other words, the storage capacitance can be increased. Accordingly, the present invention ensures that without resort to increase of the junction area, the saturating exposure amount can be increased to a large extent and the upper limit of the dynamic range can be raised.

Since the junction area need not be increased for increasing the saturating exposure amount as described above, it is possible to minimize the junction area of the photodiode with the view of improving the resolution and reducing the dark current.

Further, the polysilicon film 5 disposed on the first thin layer 31 of the insulating film 3 can completely shut off light (ultraviolet rays) which would otherwise penetrate, by way of multiple reflections, into a portion between the light shielding film 4 and the flat portion 22 of electrode 2 and a portion between the flat portion 22 of electrode 2 and the one major surface 11 of semiconductor substrate 1. Accordingly, the present invention also ensures that the deterioration of the pn junction edges due to ultraviolet ray irradiation can be prevented and the dark current can be reduced to lower the lower limit of the dynamic range. Experimental results showed that the dark current increased more than ten times in a conventional device after irradiation of high energy UV radiation of 10 $\mu W/cm^2$ for 100 hours, while that in the device according to an embodiment of this invention only became about twice as large as the initial value after 500 hours irradiation.

Effects brought about by the present invention will now be described by presenting an example of structural dimensions.

With a photodiode array of juxtaposition of photodiodes each having a rectangular junction area of 2000 $\mu m$ length and 37 $\mu m$ width at 3 $\mu m$ interval, the junction capacitance was 7.5 pF. The polysilicon film of 3500 Å thickness and 15 $\mu m$ width was so formed as to extend over a portion of the substrate lying between the edges of adjacent pn junctions (3 $\mu m$ width) and over the semiconductor regions 13 beyond the pn junction edge by 6 $\mu m$ on each side, thereby apparently increasing the capacitance of the photodiode to 13.8 pF. The thickness of the silicon oxide film interposed between the polysilicon film and the semiconductor substrate surface was 500 Å, and the phosphosilicate glass layer had a thickness of 6000 Å between the polysilicon film and the flat portion of electrode. Thanks to the increase in the cell capacitance, the dynamic range was widened by 180%.

While in the absence of the polysilicon film the dark current gradually increased as the total exposure time increased, almost no increase in the dark current was observed in the presence of the polysilicon film.

Figure 5:
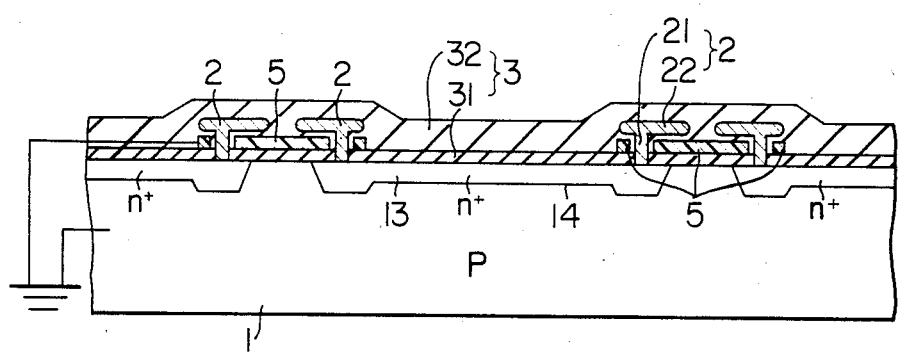
FIG. 5 is a schematic sectional view illustrating another embodiment of the invention.

FIG. 5 shows another embodiment of the semiconductive photodetector device according to the invention which is identical with the device shown in FIGS. 2 and 3 excepting that light shielding films 4 are not provided. Because of elimination of the light shielding films 4, this embodiment is slightly inferior to the device of FIGS. 2 and 3 in that the dark current may be slightly increased due to some increase in light penetrating into a portion between adjacent flat portions 22 of electrodes 2 and passing through a portion between the leg portion 21 of electrode 2 and the polysilicon film 5 and reaching the pn junction. However, the apparent capacitance of the photodiode can also be increased in this embodiment as in the device of FIGS. 2 and 3. This embodiment will therefore be suitable for a case wherein the upper limit of the dynamic range is desired to be raised, while slightly sacrificing the lower limit. Further, with the construction of this embodiment, the manufacture process can be simplified greatly.

Figure 6:
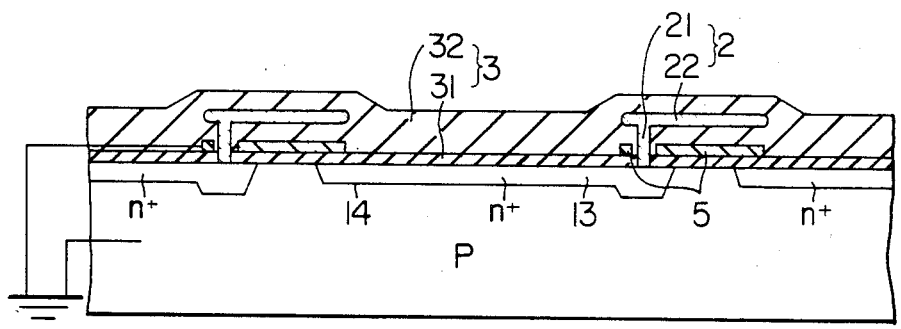
FIG. 6 is a schematic sectional view illustrating still another embodiment of the invention.

FIG. 6 shows still another embodiment of the semiconductive photodetector device according to the invention which is characterized in that an electrode 2 is provided for one side of each semiconductor region 13, while a flat portion 22 of the electrode 2 extends over pn junction edges of adjacent semiconductor regions. In the previous embodiments, the electrode 2 extends to completely round the total peripheral edge of each of the semiconductor regions 13 to ensure that the pn junction edge can be protected from the irradiation of light and the reading or lateral resistance of the semiconductor region can be reduced. However, according to the present invention, the junction area can be minimized and therefore, the electrode extending in the longitudinal direction of the elongated semiconductor region 13 can be provided only on one side of the semiconductor region, without imparting a distinct increase in the reading resistance. Thus, by extending the flat portion 22 of the electrode 2 provided for one semiconductor region 13 to the peripheral edge of the adjacent semiconductor region for the purpose of protection of the pn junction edge, a device of the similarly low dark current and high saturating exposure characteristics as those of the previous embodiment of FIGS. 2 and 3 can be materialized. Here, it may be noted that the capacitance between the polysilicon film 5 and the highly doped region 13 plays the most important role for increasing the capacitance. In contrast to the FIG. 5 embodiment which encounters the problem of slight increase in the dark current due to the fact that the flat portions of adjacent electrodes are spaced apart a predetermined distance to assure electrical insulation and hence light penetrates into the spacing, this embodiment employing the prolonged flat portion extending beyond the edge of adjacent pn junction can eliminate such a problem.

While the invention has been described by way of preferred embodiments, it is not limited to these embodiments and may be modified in various manners. For example, (1) in connection with the embodiment of FIGS. 2 and 3, the light shielding film may be grounded so as to further increase the capacitance of the capacitors connected in parallel with the junction capacitor, (2) the conductivity type may obviously be reversed in each of the previous embodiments, (3) the electrode may contact the semiconductor region 13 intermittently as well as continuously at the peripheral area thereof, and (4) the poly-silicon film 5 may be connected to the semiconductor substrate 1 and the semiconductor substrate 1 may be grounded.

We claim:

1. A semiconductive photodetector device comprising:

a semiconductor substrate of one conductivity type having a pair of major surfaces;

a plurality of semiconductor regions of the other conductivity type which are juxtaposed and contiguous to one major surface of said semiconductor substrate, said one major surface serving as a light receiving surface, said semiconductor substrate and semiconductor regions forming pn junctions therebetween having edges terminated at said one major surface;

an insulating film overlying said one major surface of said semiconductor substrate;

a plurality of electrodes disposed inside said insulating film and having each a leg portion which extends in a direction perpendicular to said one major surface and which has one end in ohmic contact to an associated semiconductor region and a flat portion which is contiguous to the other end of said leg portion and which extends in a direction substantially parallel to said one major surface so as to optically shield an edge of the pn junction of the associated semiconductor region and which extends above a portion of said semiconductor substrate lying between edges of adjacent pn junctions; and a polysilicon film interposed between said flat portion of said electrode inside the insulating film and said one major surface of said semiconductor substrate, extending above said edge of the pn junction and a peripheral portion of said associated semiconductor region, and electrically connected to said semiconductor substrate, said polysilicon film optically shielding edges of adjacent pn junctions and the portion of said semiconductor substrate lying between edges of adjacent pn junctions and forming a capacitance with said associated semiconductor region.

2. A semiconductive photodetector device according to claim 1 wherein said insulating film comprises a first layer of silicon oxide which is in contact with said one major surface of said semiconductor substrate and a second layer of phosphosilicate glass which is formed on said first layer and thicker than said first layer, and said polysilicon film is interposed between the first and second layers.

3. A semiconductive photodetector device according to claim 1 wherein the electrode extends over and rounds the overall peripheral edge of each of the semiconductor regions.

4. A semiconductive photodetector device according to claim 3 wherein said insulating film comprises a first layer of silicon oxide which is in contact with said one major surface of said semiconductor substrate and a second layer of phosphosilicate glass which is formed on said first layer and thicker than said first layer, and said polysilicon film is interposed between the first and second layers.

5. A semiconductive photodetector device according to claim 1 wherein said semiconductor regions are each of rectangular shape with longitudinal sides directed in one direction and juxtaposed in a direction perpendicular to the longitudinal direction, and the electrode is provided along one longitudinally extending peripheral side of the semiconductor region and has a flat portion which extends toward an adjacent semiconductor region to optically shield the pn junction edge of the adjacent semiconductor region.

6. A semiconductive photodetector device according to claim 5 wherein said insulating film comprises a first layer of silicon oxide which is in contact with said one major surface of said semiconductor substrate and a second layer of phosphosilicate glass which is formed on said first layer and thicker than said first layer, and said polysilicon film is interposed between the first and second layers.

7. A semiconductive photodetector device according to claim 1 further comprising a light shielding film which is more remote from said one major surface of said semiconductor substrate than said flat portion of said electrode and which extends to shield the edges of adjacent pn junctions and the portion of said semiconductor substrate lying between the edges of adjacent pn junctions.

8. A semiconductive photodetector device according to claim 7 wherein said insulating film comprises a first layer of silicon oxide which is in contact with said one major surface of said semiconductor substrate and a second layer of phosphosilicate glass which is formed on said first layer and thicker than said first layer, and said polysilicon film is interposed between the first and second layers.

9. A semiconductor radiation-detecting device comprising:
a semiconductor substrate of one conductivity type, having a pair of main surfaces, one of said main surfaces serving as a light receiving surface;
a plurality of semiconductor regions of the other conductivity type, disposed adjacent to said one of said main surfaces serving as a light receiving surface, and juxtaposed to one another, each region forming a pn junction with said substrate, the edge of which pn junction terminates on the one main surface;
an insulating film covering said one main surface;
electrodes formed within said insulating film, each electrode having one end ohmically contacting an associated one of the semiconductor regions at said one main surface; and
a polysilicon film formed within said insulating film, electrically isolated from said electrodes, electrically connected to said semiconductor substrate and covering the substrate at those areas which are located between the edges of the adjacent pn junctions and covering said edges of the pn junctions, and extending over peripheral portions of said semiconductor regions, the polysilicon film blocking ultraviolet ray irradiation of said edges of the pn junctions and forming capacitances with said peripheral portions of said semiconductor regions.

10. A radiation-detecting silicon device including a plurality of radiation-detecting silicon elements formed in a silicon substrate adjacent to one main surface thereof, comprising:
a plurality of pn junctions formed in the silicon substrate, defining regions of said silicon elements and having edges exposed at said one main surface;
a doped polysilicon film covering a peripheral portion of one of said regions and said exposed edge of the pn junction around said one region and having at least one aperture exposing said peripheral portion of the one region; and
a metal electrode formed on said peripheral portion, thereby forming an electrical contact therewith, and above said polysilicon film, thereby forming an electrical capacitor therewith,
whereby said polysilicon film can act to optically shield said exposed edge of the pn junction around said one region and can form a capacitance with said metal electrode.

11. A semiconductive photodetector device according to claim 5 wherein said electrode is provided along only one longitudinally extending peripheral side of said semiconductor region.

12. A semiconductive photodetector device according to claim 7 wherein said light shielding film is grounded.

13. A semiconductive photodetector device according to claim 1 wherein both said polysilicon film and said semiconductor substrate are connected to ground.

14. A semiconductive photodetector device according to claim 1 wherein said polysilicon film extends above said portion of said semiconductor substrate lying between edges of adjacent pn junctions, in addition to extending above said edge of said pn junction and said peripheral portion of said associated semiconductor region.

15. A semiconductive photodetector device according to claim 1, wherein said semiconductor substrate and plurality of semiconductor regions together form a plurality of photodiodes.

16. A semiconductor radiation-detecting device according to claim 9, wherein said semiconductor substrate and plurality of semiconductor regions together form a plurality of photodiodes.

17. A radiation-detecting silicon device according to claim 10, wherein said silicon substrate is exposed between exposed edges of adjacent ones of said plurality of pn junctions, and said polysilicon film also extends over the exposed silicon substrate between said exposed edges.

18. A radiation-detecting silicon device according to claim 10 wherein said silicon elements are photodiodes.

19. A radiation-detecting silicon device according to claim 10 wherein said polysilicon film is electrically connected to said silicon substrate, and wherein said polysilicon film forms an electrical capacitor both with said metal electrode and with said peripheral portion of one of said regions.

20. A semiconductive photodetector device according to claim 1 wherein said semiconductor substrate is of p-type and said semiconductor regions are of n-type.

21. A semiconductive photodetector device according to claim 20 wherein said polysilicon film is electrically grounded.

22. A semiconductor radiation-detecting device according to claim 9 wherein said semiconductor substrate is of p-type and said semiconductor regions are of n-type.

23. A semiconductor radiation-detecting device according to claim 22 wherein said polysilicon film is electrically grounded.

24. A radiation-detecting silicon device according to claim 10 wherein said silicon substrate is of p-type and said regions are of n-type.

25. A radiation-detecting silicon device according to claim 24 wherein said polysilicon film is electrically grounded.

* * * * *